(12) United States Patent
Simon

(10) Patent No.: US 8,067,842 B2
(45) Date of Patent: Nov. 29, 2011

(54) INTEGRATED CIRCUIT PACKAGE, NOTABLY FOR IMAGE SENSOR, AND METHOD OF POSITIONING

(75) Inventor: Gilles Simon, Le Fontanil (FR)

(73) Assignee: E2V Semiconductors (FR)

( * ) Notice: Subject to any disclaimer, the term of this patent is extended or adjusted under 35 U.S.C. 154(b) by 59 days.

(21) Appl. No.: 12/525,116

(22) PCT Filed: Mar. 7, 2008

(86) PCT No.: PCT/EP2008/052756
§ 371 (c)(1),
(2), (4) Date: Sep. 14, 2009

(87) PCT Pub. No.: WO2008/110511
PCT Pub. Date: Sep. 18, 2008

(65) Prior Publication Data
US 2010/0001357 A1    Jan. 7, 2010

(30) Foreign Application Priority Data
Mar. 9, 2007 (FR) .................................. 07 01738

(51) Int. Cl.
*H01L 23/544* (2006.01)
(52) U.S. Cl. .................. 257/797; 257/703; 257/E27.13; 257/431
(58) Field of Classification Search .................. 257/797, 257/491
See application file for complete search history.

(56) References Cited

U.S. PATENT DOCUMENTS

| | | | | | |
|---|---|---|---|---|---|
| 3,869,787 | A | * | 3/1975 | Umbaugh | 29/834 |
| 4,710,250 | A | * | 12/1987 | Kojima et al. | 156/89.16 |
| 5,223,746 | A | * | 6/1993 | Abe et al. | 257/678 |
| 5,521,427 | A | * | 5/1996 | Chia et al. | 257/666 |
| 5,861,654 | A | * | 1/1999 | Johnson | 257/433 |
| 5,878,485 | A | * | 3/1999 | Wood et al. | 29/825 |
| 6,025,728 | A | * | 2/2000 | Hembree et al. | 324/750.29 |
| 6,051,784 | A | * | 4/2000 | Yoon | 174/538 |
| 6,249,049 | B1 | * | 6/2001 | Kamada et al. | 257/703 |
| 6,331,452 | B1 | * | 12/2001 | Gall | 438/127 |
| 6,417,685 | B1 | * | 7/2002 | Akram et al. | 324/750.25 |
| 6,486,549 | B1 | * | 11/2002 | Chiang | 257/723 |
| 6,617,194 | B2 | * | 9/2003 | Shimoe et al. | 438/106 |

(Continued)

FOREIGN PATENT DOCUMENTS

EP 1473777 11/2004

(Continued)

*Primary Examiner* — Victor A Mandala
*Assistant Examiner* — William Harriston
(74) *Attorney, Agent, or Firm* — Lowe Hauptman Ham & Berner, LLP

(57) ABSTRACT

The invention relates to the fabrication of integrated circuits in general, and notably the circuits of image sensors intended to form the electronic core of photographic apparatus or cameras. The chip is first aligned with respect to the package and then the package is aligned with respect to the optical system. The alignment of the chip with respect to the package is done optically. The alignment of the package with respect to the system is done mechanically with respect to the edges of the package. According to the invention, provision is made for optical marks to be provided on the package, these marks each having an edge aligned with a lateral edge of the package, so as to minimize the positioning errors which would be due to inaccurate positioning of the chip with respect to the edges of the package.

19 Claims, 1 Drawing Sheet

U.S. PATENT DOCUMENTS

| | | | |
|---|---|---|---|
| 6,683,298 B1 * | 1/2004 | Hunter et al. | 250/239 |
| 6,836,003 B2 * | 12/2004 | Corisis et al. | 257/666 |
| 7,132,737 B2 * | 11/2006 | Miyazaki | 257/678 |
| 7,327,005 B2 * | 2/2008 | Brechignac et al. | 257/434 |
| 7,348,532 B2 * | 3/2008 | Narita et al. | 250/208.1 |
| 2002/0048436 A1 * | 4/2002 | Nishikawa et al. | 385/88 |
| 2002/0063974 A1 * | 5/2002 | Stern et al. | 359/804 |
| 2002/0180033 A1 * | 12/2002 | Shimoe et al. | 257/704 |
| 2005/0218513 A1 * | 10/2005 | Seko | 257/734 |
| 2007/0102831 A1 * | 5/2007 | Machida et al. | 257/787 |
| 2008/0284048 A1 * | 11/2008 | Kim et al. | 257/797 |

FOREIGN PATENT DOCUMENTS

| | | |
|---|---|---|
| JP | 63155648 | 6/1988 |
| JP | 01-217950 | 8/1989 |

* cited by examiner

INTEGRATED CIRCUIT PACKAGE, NOTABLY FOR IMAGE SENSOR, AND METHOD OF POSITIONING

CROSS-REFERENCE TO RELATED APPLICATIONS

The present Application is based on International Application No. PCT/EP2008/052756, filed on Mar. 7, 2008, which in turn corresponds to French Application No. 0701738, filed on Mar. 9, 2007, and priority is hereby claimed under 35 USC §119 based on these applications. Each of these applications are hereby incorporated by reference in their entirety into the present application.

FIELD OF THE INVENTION

The invention relates to the fabrication of integrated circuits in general, and notably the circuits of image sensors intended to form the electronic core of photographic apparatus or cameras.

The text hereinafter will speak solely of cameras, whether photographic apparatus intended for taking stills or apparatus intended for taking movies.

BACKGROUND OF THE INVENTION

A significant problem which arises is the very accurate positioning of the image sensor (an integrated circuit chip) with respect to the optics of the camera which focuses an image onto this sensor.

In an ideal situation, it is necessary for the plane of the integrated circuit chip to be perfectly perpendicular to the optical axis, and, assuming this condition is realized, it is necessary on the one hand for the active surface of the image sensor to be in the focal plane of the chip (Z-wise alignment), and on the other hand for the transverse and longitudinal axes of the chip (in the plane of the latter) to intersect on the axis of the optical system of the camera (X-wise and Y-wise alignment).

The present invention is concerned firstly with the X-wise and Y-wise alignment, but also with the Z-wise alignment. The positioning of the image sensor with respect to the camera is in principle done by mechanical means which take the package of the chip and place it as accurately as possible with respect to the camera, both X-wise and Y-wise (in a "horizontal" plane which is the plane of the surface of the chip) and Z-wise (in a "vertical" direction perpendicular to the surface of the chip). The error margin related to the means of mechanical positioning of the package is from one to two hundred micrometers. It depends mainly on the dimensional tolerances of the package. But this error margin assumes that the chip is perfectly positioned (in general centered) X-wise and Y-wise in its package, and at a height that is well known Z-wise with respect to the lower surface of the package.

To center the chip in the package, and at the same time to solder connection wires between the chip and the package, machines for encapsulation within packages generally use optical positioning by virtue of indexing marks formed on the package. The machine grasps the chip, detects the position of the marks, and places the chip at a location centered with respect to the marks. This optical positioning is necessary in particular so as to contrive matters such that the connection wires between the chip and the package are correctly put in place and soldered to the respective metal connection pads of the chip and of the package. These indexing marks are used in particular on ceramic packages, made by superposition followed by firing of multiple layers of green ceramic coated with silk-screen-printed metallic depositions; indexing marks are used for all sorts of integrated circuits, that is to say not only on image sensors. So that the positioning of the chip with respect to the connection pads of the package is optimized, the indexing marks generally consist of metallized zones forming part of the same metallization layers as the connection pads of the package; the marks are therefore silk-screen-printed at the same time as the connection pads and other conductors, if any.

But though the position of the marks is fairly accurate with respect to the pads of the package since they are silk-screen-printed at the same time, with however a certain inaccuracy resulting from the mode of fabrication of the packages based on the firing of green ceramic, it is not very accurate with respect to the edges of the package since the silk-screen printing is not referenced with respect to the edges of the package given that it is carried out before cutting the ceramic layers into individual packages. This results from the processes for fabricating these packages; typically, a ceramic package is made by superposing sheets of green ceramic silk-screen-printed with conducting pastes; the superposed stack is thereafter cut up into individual packages which are fired at high temperature. The position of the cutting of the stack with respect to the indexing marks is not sufficiently accurate because of the firing operation which globally reduces the dimensions of the layers in a proportion of about 15%. The tolerance in relative position of the cutting patterns or of the silk-screen print patterns of the layers after firing is not better than 150 micrometers, or indeed even less for large packages, and this tolerance is added to the global error in positioning the chip when the final accuracy of positioning of the chip with respect to the camera optics is evaluated.

This insufficiently accurate positioning of the chip with respect to the camera optics demands an expensive manual adjustment, for example a final position adjustment by micrometric screws before definitive gluing of the package of the chip in the camera.

SUMMARY OF THE INVENTION

An aim of the invention is to propose means for improving the relative positioning between an image sensor mounted on a multilayer ceramic package and the optics of the camera.

To achieve this, the invention proposes a multilayer ceramic integrated circuit package which comprises several optical indexing marks for positioning an integrated circuit chip in the package, the marks having an edge aligned with an exterior lateral edge of the package. Preferably, there is at least one mark on a first edge and two marks on an edge perpendicular to the first.

The marks are preferably realized by portions of a conducting layer also serving to form interconnection pads for soldering connection wires to these pads.

Preferably, the height of the marks above a flat base of the package is equal to the height of the upper surface of the chip above the flat base on which it is placed. The thickness of glue or solder that may exist between the chip and the base is preferably taken into account in this determination of height. The marks are thus placed in a plane which is as near as possible to the plane of the upper surface of the chip mounted in the package.

The marks are preferably placed on a peripheral portion of the package, in a plane situated below the highest part of the package. They can be formed either on a peripheral recess surrounding the whole of the package, or in local notches (typically one notch per mark) hollowed out in the upper part of the package. If the mark is placed in a respective notch, it can occupy the entirety or just a part of the base of the notch.

The method of alignment according to the invention, which is a method of accurate positioning of an image sensor chip with respect to an optical system of a camera, comprises two steps:

optical alignment, by machine, of the chip in an integrated circuit package comprising at least one optical indexing mark having an edge aligned with an exterior lateral edge of the package;

and mechanical positioning of the exterior edges of the package with respect to the camera.

In practice, the multilayer ceramic package is fabricated by superposing plates of layers of green ceramic silk-screen-printed and cut according to desired patterns, and then subdividing the stack of plates of green ceramic into portions each corresponding to an individual package; the silk-screen-printed patterns preferably comprise at least one indexing mark pattern extending at one and the same time over two adjacent portions, the division into individual portions being done along a line slicing this pattern into two marks each having an edge aligned with the cut edge of a respective package.

The indexing marks can serve as either mechanical or optical height-wise alignment reference for accurate positioning of the package along the optical axis of the camera.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

An image sensor in the form of a multilayer ceramic package is considered by way of example, the invention being most particularly beneficial for an image sensor although the indexing marks are useful for any other type of integrated circuit. The image sensor is, in this example, a multilinear strip of very elongate form.

Figure 1:
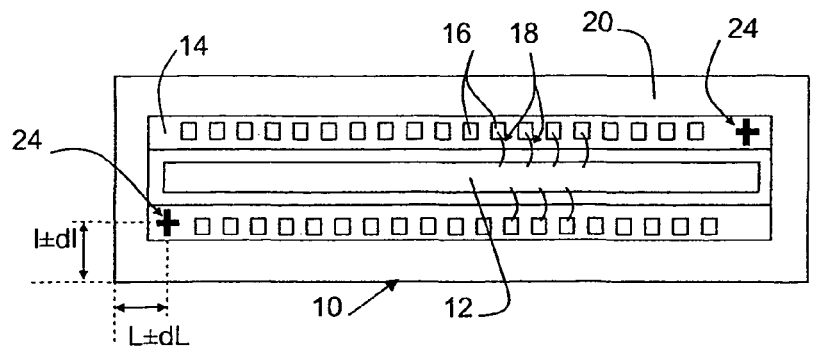
FIG. 1 represents, viewed from above, a conventional multilayer ceramic integrated circuit package, adapted here to a linear strip-shaped image sensor.
Figure 2:
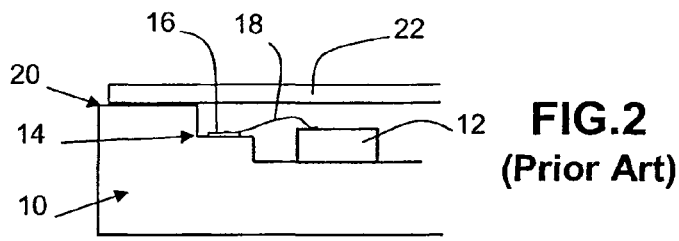
FIG. 2 represents a view in magnified section showing the arrangement of the sensor chip in its package.

The conventional image sensor package 10 of FIGS. 1 and 2 is rectangular and elongate; it is for example shaped as a double dish and possesses a flat base on which the image sensor chip 12 sits. The package comprises a first dish ledge, 14, which totally or partially surrounds the chip 12; the ledge is planar, parallel to the flat base of the package. In FIG. 1, the ledge 14 only partially surrounds the chip since this ledge is not found on the short sides of the package. The chip only possesses electrical connection pads on its long sides. If it possessed them on its four sides (as in a square chip for example) the ledge 14 would be present on the four sides.

The ledge 14 carries metallized pads 16 serving for the soldering of connection wires 18 which are soldered between each pad 16 and a corresponding pad, not represented, formed on the chip. Only a few wires 18 are represented in the drawing.

The package 10 comprises a second dish ledge 20, in a plane parallel to the plane of the first ledge 14, higher than the first, and higher than the wires 18.

Finally, the chip and its wires are preferably protected by a transparent protective plate 22 (of for example glass) which closes the upper part of the dish and which extends parallel to the flat base of the package. This plate is glued onto the whole of the periphery of the ledge 20. The transparent plate 22 protects the chip, while letting through light so as to allow the image sensor to receive an image to be converted into electronic signals.

Indexing marks 24 (at least two) are formed on the planar ledge 14. They consist of isolated portions of the metallic layer which serves to form the connection pads 16 of the package, and they have a shape affording an aid for an optical positioning system capable of pinpointing them. The contrast between the metallization of the mark 24 and the non-metallized parts which surrounds it allows this pinpointing. The marks can conventionally be cross-shaped as is represented.

These marks are used while the chip is being put in place on the flat base of the package, and while the connection wires are being soldered between the chip and the package; they are used by the chip manipulation and soldering apparatus, assisted by the optical positioning system, in placing the chip exactly at the desired location, so as to be able thereafter to automatically and very accurately solder each connection wire 18 between a pad of the chip and a respective pad 16 of the package.

The marks 24 are placed in a very accurate manner with respect to the pads 16 of the package. They are moreover formed in the same plane and with the aid of the same mask and of the same etching, or more generally silk-screen printing, operation. Thus, there is almost certainly a very small margin of positioning error between these marks and the pads.

But these marks are not very accurately positioned with respect to the edges of the package. They are for example at a distance I from a long edge in the direction of the width of the package and a distance L from a short edge along the length of the package, as is represented in FIG. 1. The uncertainty in the values of I and L is significant since only the position of the mark with respect to the pads is considered to be significant and because the operations of high-temperature firing of the ceramic engender a significant but not very accurate dimensional shrinkage (about 15%).

The invention proposes that the construction of the indexing mark be modified so that the mark possesses an edge aligned with an edge of the package. The uncertainty in the positioning of this mark with respect to this edge becomes zero. If there is at least one mark on two perpendicular sides, there is then at least one mark whose uncertainty of positioning with respect to an edge is zero and another mark whose uncertainty with respect to a perpendicular edge is zero.

If the marks are silk-screen-printed or etched by the same mask as the metallized pads, the uncertainty in the positioning of the mark with respect to these pads remains the same as in the case of FIG. 1, that is to say small. All in all the chip will now be positioned correctly not only with respect to the pads but also very accurately with respect to the edges of the package.

Figure 3:
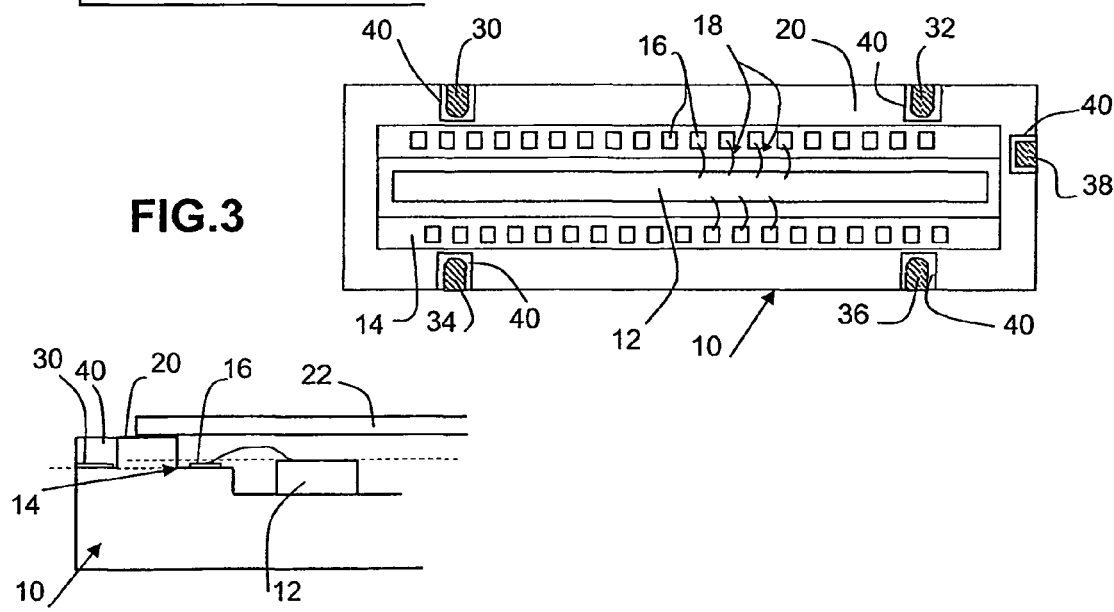
FIG. 3 represents an integrated circuit package modified according to the invention.
Figure 4:
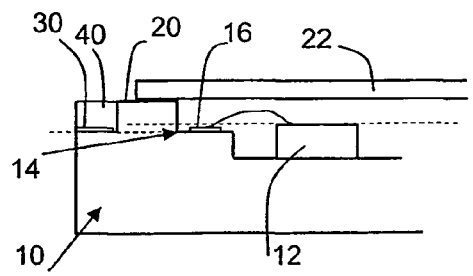
FIG. 4 represents a view in magnified section of the package of FIG. 3 with its chip.

FIG. 3 and FIG. 4 represent the package according to the invention. The same references as in FIGS. 1 and 2 are used for the same elements. Five marks have been represented by way of example: two marks 30 and 32 on one long side, two marks 34 and 36 on the other long side, and a mark 38 on a short side perpendicular to the long sides. A group of just three marks could suffice (two on a long side, one on a short side), or indeed even just two (one on each of two perpendicular sides).

Each mark possesses an edge rigorously aligned with the respective side on which it is placed. This result is easy to obtain having regard to the customary method of fabricating ceramic packages: cutting out, by stamping, plates of green ceramic of fairly large dimension so as to simultaneously form several juxtaposed packages; silk-screen printing of metallizations on these plates, for the plurality of packages; stacking of the layers; cutting of the stacked plates into individual packages; and firing of the ceramic. During the silk-screen printing, the indexing marks will be able to be formed as a mark twice as long serving for two packages at one and the same time, but this is not compulsory; when cutting along a line separating two juxtaposed packages, the mark is sliced in two and each package has a mark whose cut edge is exactly aligned with the edge of the package.

In FIGS. 3 and 4, the marks have been represented as each being arranged in a notch 40 hollowed out in the upper ledge 20. The depth of the notch is preferably equal to the difference in height between the ledge 20 (which constitutes the upper surface of the package) and the ledge 14, so that the marks can be silk-screen-printed at the same time as the metallized pads on a single surface of green ceramic which is the surface of the ledge 14. The notches are formed during the operation of cutting/stamping the plates of green ceramic (before these plates are stacked).

The marks will be used by the optical positioning system in placing the chip and soldering the connection wires between the chip and the pads 16. Then, when positioning the package (containing the chip) inside a camera, or inside a camera optical system, the positioning will be mechanical with respect to the edges of the package, both in the horizontal plane (X-wise and Y-wise) and along the optical axis (Z-wise, perpendicularly to the base of the package).

Preferably, the height of the base of the notch above the flat base of the package is equal to the height of the upper surface of the chip above this flat base (taking account where relevant of a thickness of glue between the chip and the base of the package). Thus, the optical mark is in the plane of the upper surface of the chip, which is the plane on which the camera's focusing optics will have to focus an image. Even better, the marks can then serve furthermore for the accurate positioning (optical or mechanical) of the package in the camera in a direction Z perpendicular to the base of the package, that is to say in the direction of the optical axis of the camera.

Matters will be contrived such that the glass plate does not cover the notches and the marks (or at the very least the genuinely useful part of the notches and marks). The vertical positioning, in the height-wise direction Z, of the package with respect to the camera is thus facilitated.

Figure 5:
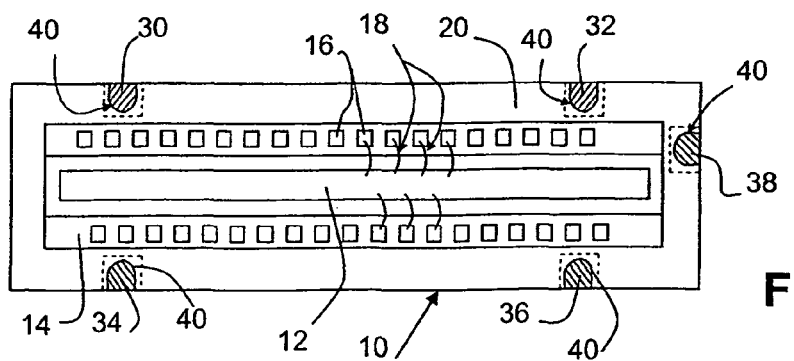
FIG. 5 represents a variant embodiment of the package according to the invention.

In FIG. 3, marks which do not occupy the whole of the base of the notches have been represented. It is also possible, as is represented in FIG. 5, to use notches which are smaller than the silk-screen-printed marks, so that the mark occupies the whole of the base of the notch and it is the notch itself which defines the edges of the mark (edges other than the edge aligned with the package edge). The dashed lines of FIG. 5 indicate the metallized mark surface which extends not only within the notch but all the way around the edges of the notch.

Conversely, the marks could also not be formed in notches and quite simply be silk-screen-printed on a continuous plane ledge, recessed with respect to the upper surface 20 of the package, this ledge extending all the way around the exterior periphery of the package. The height of this exterior ledge would then be the same as the height of the interior ledge 14.

Represented in FIG. 4 are indexing marks which are in the plane of the connection pads 16 but which are not necessarily in the plane of the top of the chip.

In FIG. 6, it has been chosen to place the marks in a plane which is that of the connection pads 16 but which is also the plane of the upper surface of the chip 12. The plane of the upper surface is the plane on which the optical system of the camera will have to focus the images.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A multilayer ceramic integrated circuit package comprising:
    an integrated circuit chip;
    several optical indexing marks for positioning the integrated circuit chip in the package,
    wherein each of the marks has an edge coincided with an exterior lateral edge of the package.

2. The integrated circuit package as claimed in claim 1, wherein at least one of the marks is located on a first edge of the package and two of the marks are located on a second edge perpendicular to the first edge.

3. The integrated circuit package as claimed in claim 1, wherein the marks have portions of a conducting layer that serves to form interconnection pads for soldering connection wires to the interconnection pads.

4. The package as claimed in claim 1, wherein at least one mark is formed inside a notch formed on an upper surface of the package.

5. The package as claimed in claim 4, wherein said as least one mark occupies the whole of the base of the notch.

6. The package as claimed in claim 1, wherein the marks are formed on a peripheral ledge surrounding the whole of the periphery of the package and situated below the upper surface of the package.

7. The package as claimed in claim 1, wherein the integrated circuit chip is soldered and linked electrically to the package, said chip being an image sensor for a camera.

8. The integrated circuit package as claimed in claim 7, wherein a height of the marks above a flat base of the package is equal to the height of the upper surface of the chip above the flat base on which it is placed.

9. A method of accurate positioning of an image sensor chip with respect to an optical system of a camera, comprising
    a step of optical alignment, by machine, of the chip in a multilayer ceramic integrated circuit package comprising at least one optical indexing mark, and a step of mechanical positioning of the edges of the package with respect to the camera,
wherein the mark has an edge coincided with an exterior lateral edge of the package.

10. The method as claimed in claim 9, wherein the multilayer ceramic package is fabricated by
   superposing plates of green ceramic silk-screen-printed and cut according to desired patterns, and then
   subdividing the superposition of plates of green ceramic into portions each corresponding to an individual package,
   wherein the silk-screen-printed patterns comprise at least one indexing mark pattern extending at one and the same time over two adjacent portions, the division into individual portions being done along a line slicing this pattern into two marks each having an edge aligned with the cut edge of a respective package.

11. The integrated circuit package as claimed in claim 2, wherein the marks have portions of a conducting layer that serves to form interconnection pads for soldering connection wires to the interconnection pads.

12. The package as claimed in claim 2, wherein at least one mark is formed inside a notch formed on an upper surface of the package.

13. The package as claimed in claim 3, wherein at least one mark is formed inside a notch formed on an upper surface of the package.

14. The package as claimed in claim 12, wherein said at least one mark occupies the whole of the base of the notch.

15. The package as claimed in claim 13, wherein said at least one mark occupies the whole of the base of the notch.

16. The package as claimed in claim 3, wherein the integrated circuit chip is soldered and linked electrically to the package, said chip being an image sensor for a camera.

17. The integrated circuit package as claimed in claim 16, wherein a height of the marks above a flat base of the package is equal to the height of the upper surface of the chip above the flat base on which it is placed.

18. The package as claimed in claim 4, further comprising an integrated circuit chip soldered and linked electrically to the package, said chip being an image sensor for a camera.

19. The integrated circuit package as claimed in claim 18, wherein a height of the marks above a flat base of the package is equal to the height of the upper surface of the chip above the flat base on which it is placed.

* * * * *